United States Patent
Hamaguchi et al.

(10) Patent No.: US 9,116,434 B2
(45) Date of Patent: Aug. 25, 2015

(54) ELECTRON BEAM EXPOSURE METHOD

(71) Applicant: ADVANTEST CORPORATION, Tokyo (JP)

(72) Inventors: Shinichi Hamaguchi, Tokyo (JP); Masaki Kurokawa, Tokyo (JP); Masahiro Takizawa, Tokyo (JP)

(73) Assignee: Advantest Corp., Tokyo (JP)

( * ) Notice: Subject to any disclaimer, the term of this patent is extended or adjusted under 35 U.S.C. 154(b) by 22 days.

(21) Appl. No.: 14/056,651

(22) Filed: Oct. 17, 2013

(65) Prior Publication Data

US 2014/0120475 A1    May 1, 2014

(30) Foreign Application Priority Data

Oct. 25, 2012  (JP) ................................ 2012-235507

(51) Int. Cl.
*G03F 1/20* (2012.01)
*G03F 7/20* (2006.01)
*H01J 37/317* (2006.01)
*G03F 1/50* (2012.01)

(52) U.S. Cl.
CPC ............... *G03F 7/2037* (2013.01); *G03F 1/20* (2013.01); *H01J 37/3174* (2013.01); *G03F 1/50* (2013.01); *G03F 7/2063* (2013.01); *H01J 2237/31776* (2013.01)

(58) Field of Classification Search
CPC ................................ G03F 1/20; G03F 7/2037
USPC .............................................. 430/5, 296, 942
See application file for complete search history.

(56) References Cited

U.S. PATENT DOCUMENTS 6,656,663 B2 * 12/2003 Fujiwara ........................ 430/296

FOREIGN PATENT DOCUMENTS

| JP | H08-195339 | 7/1996 |
| JP | 2001-308004 | 11/2001 |
| JP | 2003-347192 | 12/2003 |
| JP | 2011-049556 | 3/2011 |

OTHER PUBLICATIONS

Office action issued by Japanese Patent Office for the counterpart Japanese application and its English translation.

* cited by examiner

*Primary Examiner* — Christopher Young
(74) *Attorney, Agent, or Firm* — Muramatsu & Associates (57) ABSTRACT

An electron beam exposure method includes the steps of: preparing an exposure mask having a plurality of opening patterns formed by dividing a drawing object pattern into exposable regions; and drawing the drawing object pattern by performing exposure with an electron beam passing through the opening patterns of the exposure mask. Each end portion serving as a joint in each opening pattern of the exposure mask is provided with a joining portion tapered in a width of the opening pattern. The exposure is performed in such a way that portions drawn through adjacent joining portions overlap each other.

4 Claims, 11 Drawing Sheets

ELECTRON BEAM EXPOSURE METHOD

CROSS-REFERENCE TO RELATED APPLICATIONS

This application is based upon and claims the benefit of priority of the prior Japanese Patent Application No. 2012-235507, filed on Oct. 25, 2012, the entire contents of which are incorporated herein by reference.

FIELD

The embodiments discussed herein are related to an electron beam exposure method.

BACKGROUND

For a semiconductor device such as an LSI, a technique called silicon photonics to establish connection to the semiconductor device through optical waveguides is currently under development to solve a signal delay attributed to metal wiring.

The optical waveguide employs silicon which is translucent to light in a near infrared region, and has a pattern width of several hundreds of nanometers. If this fine optical waveguide has roughness in the size of several nanometers at an edge portion of a pattern, such roughness may cause a large loss and block transmission of optical signals.

Further, when an optical resonator is formed by using the optical waveguide, a wavelength of resonating light changes significantly even with slight variation in the width of a gap portion between patterns.

For these reasons, high-accuracy processing techniques are required to manufacture optical waveguides and optical elements suitable for practical use.

To this end, one conceivable method is to form a pattern in an optical element by using an electron beam exposure apparatus.

However, the line with of the optical waveguide is as large as several hundreds of nanometers. Accordingly, if an electron beam spot of the electron beam exposure apparatus is narrowed to secure required accuracy, a large number of times of irradiation are necessary and it takes long time to draw the pattern.

The above noted conventional technologies are described, for example, in Japanese Laid-open Patent Publication Nos. H08-195339 and 2011-49556.

SUMMARY

An object of the embodiments discussed herein is to provide an electron beam exposure method capable of accurately and quickly drawing a pattern.

According to an aspect to be disclosed below, there is provided an electron beam exposure method which includes the steps of: preparing an exposure mask having a plurality of opening patterns formed by dividing a drawing object pattern into exposable regions; and drawing the drawing object pattern by joining portions irradiated with an electron beam passing through the opening patterns of the exposure mask. Each end portion serving as a joint in each opening pattern of the exposure mask is provided with a joining portion tapered in a width of the opening pattern. The exposure is performed in such a way that portions drawn through every adjacent joining portions overlap each other.

According to the aspect, a pattern constituting an optical element can be quickly formed with a smaller number of times of exposure since electron beam irradiation is performed in the shapes obtained by dividing the drawing object pattern, and the time required for the exposure can be shortened while reducing edge roughness.

In addition, each end portion serving as a joint in each opening pattern of the exposure mask used for the exposure is provided with a joining portion tapered in a width of the opening pattern. The exposure is performed in such a way that portions drawn through every adjacent joining portions overlap each other. Thus, it is possible to reduce a variation in line width at the joining portions in an exposure region and to draw the pattern with less roughness.

DESCRIPTION OF EMBODIMENTS

Embodiments will be described below with reference to the accompanying drawings.

First Embodiment

A first embodiment will be described citing a race-track optical resonator as an example of an optical element.

Figure 1A:
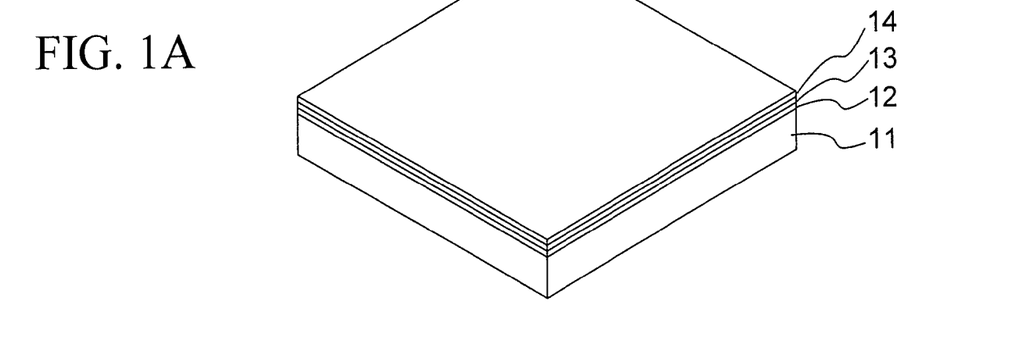
FIGS. 1A to 1C are perspective views showing a method of manufacturing a race-track optical resonator.
Figure 1B:
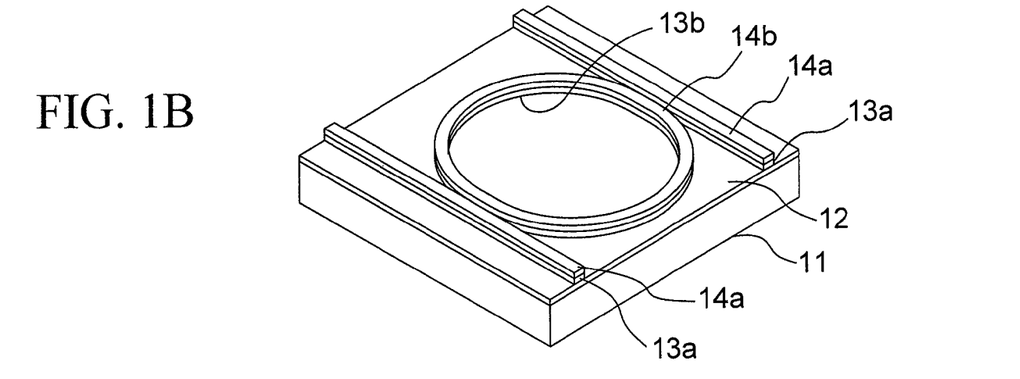
Figure 1C:
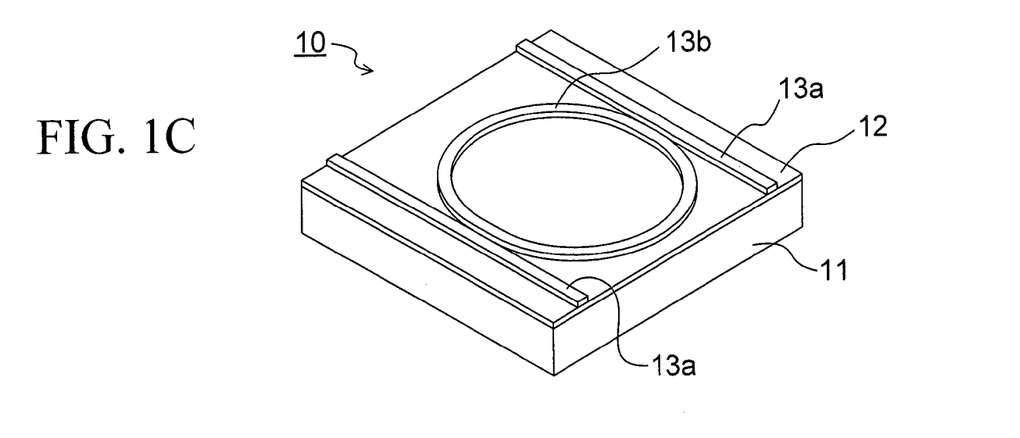

FIGS. 1A to 1C are views showing a method of manufacturing a race-track optical resonator, which are arranged in the order of steps.

First, as shown in FIG. 1A, a silicon oxide film 12, a silicon film 13, and a resist film 14 are sequentially formed on a silicon substrate 11.

Next, as shown in FIG. 1B, linear patterns 14a and an annular pattern 14b are formed by subjecting the resist film 14 to exposure using an electron beam and to development thereafter.

Subsequently, etching is carried out by using the patterns 14a, 14b of the resist film 14 collectively as a mask. Thus, portions of the silicon film 13 not covered with the resist film 14 are removed, and linear waveguide patterns 13a and an annular waveguide pattern 13b are formed.

Then, the patterns 14a, 14b of the resist film 14 are removed as shown in FIG. 1C. A race-track optical resonator 10 including the optical waveguides made of silicon is thus finished.

A line width of each of the waveguide patterns 13a, 13b of the optical resonator 10 is set to about 0.5 μm, for example, and each waveguide pattern 13a is located away from the annular waveguide pattern 13b by a predetermined distance. When an optical signal is propagated to one of the linear waveguide patterns 13a, an optical signal having a predetermined frequency corresponding to the distance between the waveguide patterns 13a, 13b is propagated and thus extracted to the annular waveguide pattern 13b.

If there is roughness on edges of the waveguide patterns 13a, 13b, the optical signal leaks out from the rough edges and a signal loss increases as a consequence. It is therefore necessary to reduce an average value of the edge roughness of each of the waveguide patterns 13a, 13b to less than several nanometers.

Meanwhile, since a frequency characteristic of the race-track optical resonator depends on the gap between each waveguide pattern 13a and the waveguide pattern 13b, gap portions between the patterns need to be manufactured with high accuracy.

Figure 2:
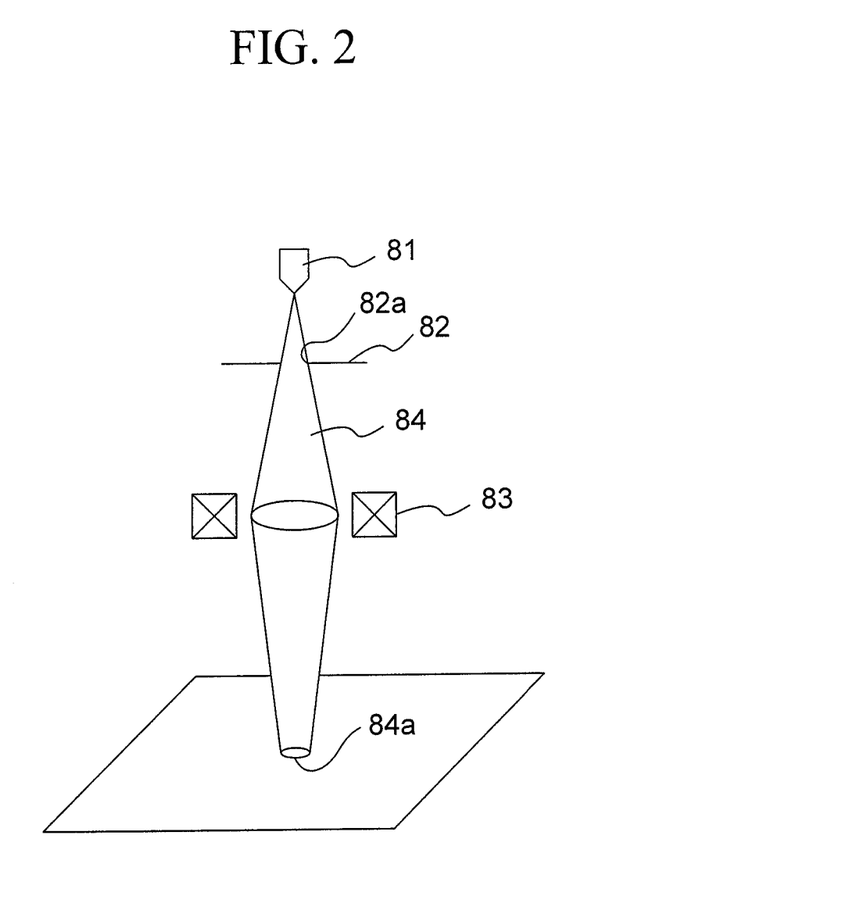
FIG. 2 is a view showing a method (a comparative example) of drawing an optical resonator by a point beam method.

FIG. 2 is a view showing an electron beam exposure method (a comparative example) using a point beam.

As shown in FIG. 2, in the electron beam exposure method using the point beam, an electron beam 84 emitted from an electron gun 81 passes through a circular aperture of a diaphragm 82, and its cross section is thereby shaped into a circular form. Then, the electron beam 84 is converged to a predetermined size by an electromagnetic lens 83 and delivered as a circular point beam shot 84a onto a sample. Thereafter, a waveguide pattern is drawn by repeating irradiation with the point beam shot 84a while shifting the position of the irradiation with the point beam shot 84a.

The above-described exposure using the point beam is mainly employed in prototype production of an optical element.

Figure 3:
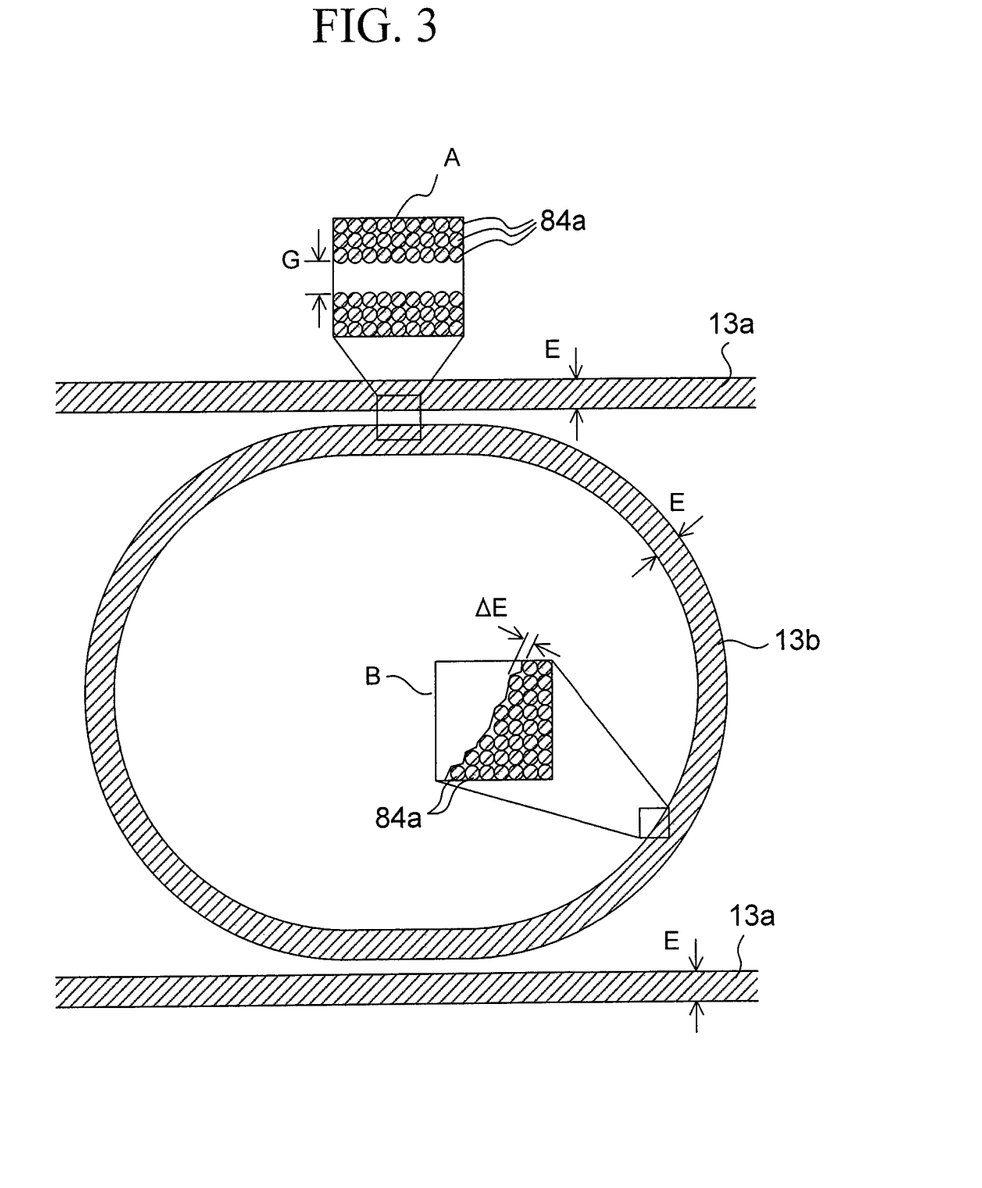
FIG. 3 is a view showing a problem of the method (the comparative example) of drawing an optical resonator using a point beam.

FIG. 3 is a view showing a problem of the electron beam exposure method (the comparative example) using the point beam.

As shown in a partially enlarged view B in FIG. 3, the electron beam exposure method using the point beam causes roughness, which occurs on an edge of the waveguide pattern 13b with a size ΔE corresponding to the beam size. Accordingly, the beam size has to be reduced in order to limit the edge roughness of the waveguide pattern 13b within a predetermined range, and the number of times of the electron beam exposure (the number of shots) has to be increased as a consequence. Hence, there is a problem that the exposure requires a long period of time.

In the meantime, as shown in a partially enlarged view A, a gap G between each waveguide pattern 13a and the waveguide pattern 13b is defined by an edge of the waveguide pattern 13a and an edge of the waveguide pattern 13b.

However, it takes time to draw the waveguide pattern 13b after completion of drawing the edge of the waveguide pattern 13a, and such a time lag is more likely to cause a displacement in the position of irradiation with the electron beam or a change in an electric current value of the electron beam.

For this reason, it is difficult to manufacture the gap G between the waveguide pattern 13a and the waveguide pattern 13b precisely in the targeted size.

This is why this embodiment focuses on a character projection method.

Figure 4:
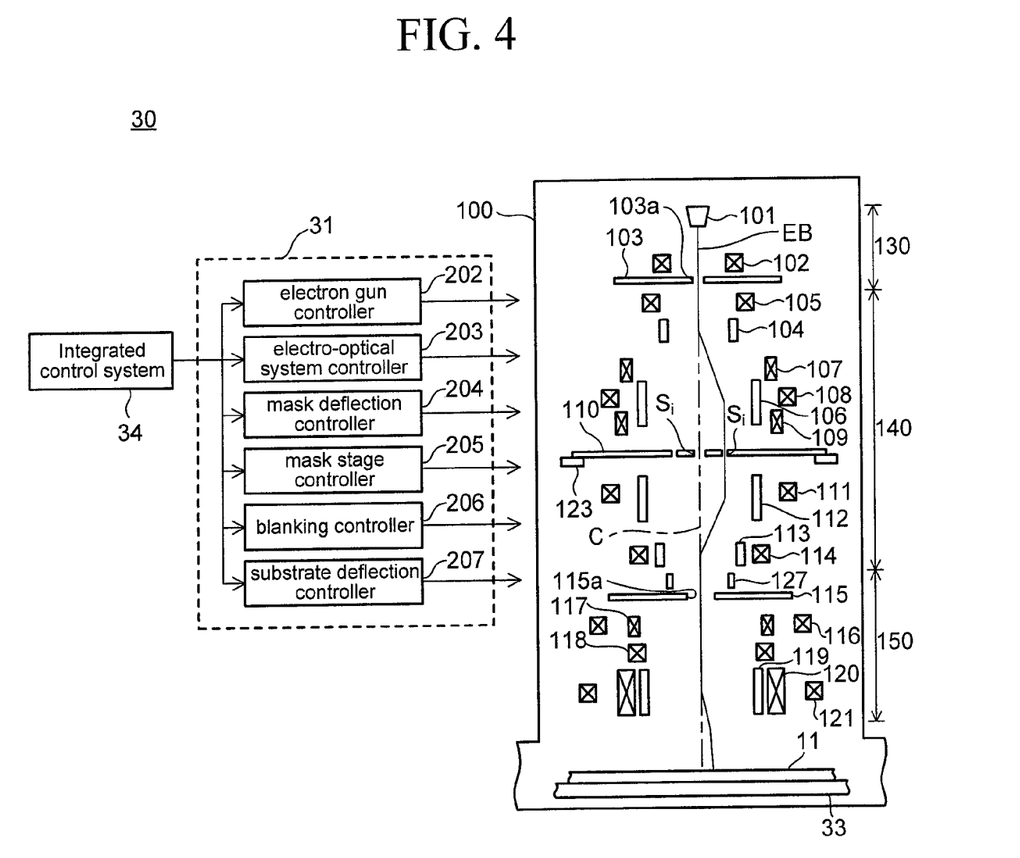
FIG. 4 is a view showing an electron beam exposure apparatus according to a first embodiment used for manufacturing an optical resonator.

FIG. 4 is a view showing an electron beam exposure apparatus of this embodiment used for manufacturing an optical resonator.

As shown in FIG. 4, an electron beam exposure apparatus 30 of this embodiment is broadly divided into an electro-optical system column 100, and a control unit 31 configured to control units of the electro-optical system column 100. Here, the electro-optical system column 100 includes an electron beam generation unit 130, a mask deflection unit 140, and a substrate deflection unit 150. The pressure inside the electro-optical system column 100 is reduced.

In the beam generation unit 130, an electron beam EB is emitted from an electron gun 101. The electron beam EB is converged by a first electromagnetic lens 102, then passes through a rectangular aperture 103a of a beam shaping mask 103, and its cross section is thereby shaped into a rectangular form.

Thereafter, the electron beam EB is focused on an exposure mask 110 by a second electromagnetic lens 105 of the mask deflection unit 140. First and second electrostatic deflectors 104, 106 deflect the electron beam EB toward a specific pattern $S_i$ formed on the exposure mask 110, whereby the cross-sectional shape of the electron beam EB is shaped into a form of the pattern $S_i$.

The exposure mask 110 is fixed to a mask stage 123. Here, the mask stage 123 is movable within a horizontal plane. In the case of using a pattern S located at a position outside a deflection range (a beam deflection region) covered by the first and second electrostatic deflectors 104, 106, the pattern S is moved into the beam deflection region by moving the mask stage 123.

Third and fourth electromagnetic lenses 108, 111 located above and below the exposure mask 110 plays a role in focusing the electron beam EB on a silicon substrate 11 by adjusting amounts of electric currents to be supplied to those lenses.

The electron beam EB which has passed the exposure mask 110 is returned to an optical axis C by deflecting actions of third and fourth electrostatic deflectors 112, 113. Then, the size of the electron beam EB is reduced by a fifth electromagnetic lens 114.

The mask deflection unit 140 is provided with first and second correction coils 107, 109, which are configured to correct deflection aberrations attributed to the first to fourth electrostatic deflectors 104, 106, 112, 113.

Then, the electron beam EB passes through an aperture 115a of a shield plate 115 constituting a part of the substrate deflection unit 150, and is projected onto the silicon substrate 11 by first and second projection electromagnetic lenses 116, 121. Thus, an image of the pattern on the exposure mask 110 is transferred to the silicon substrate 11 at a given reduction ratio such as a reduction ratio of 1/10.

The substrate deflection unit 150 is provided with a fifth electrostatic deflector 119 and an electromagnetic deflector 120. The electron beam EB is deflected by the deflectors 119, 120, whereby the image of the pattern on the exposure mask is projected to a predetermined position on the silicon substrate 11.

In addition, the substrate deflection unit 150 is provided with third and fourth correction coils 117, 118 configured to correct a deflection aberration of the electron beam EB on the silicon substrate 11.

The silicon substrate 11 is fixed to a wafer stage 33, which is movable in a horizontal direction, by a drive unit (not shown) such as a motor. It is possible to perform the exposure on the entire surface of the silicon substrate 11 by moving the wafer stage 33.

Meanwhile, the control unit 200 includes an electron gun controller 202, an electro-optical system controller 203, a mask deflection controller 204, a mask stage controller 205, a blanking controller 206, a substrate deflection controller 207, and a wafer stage controller 208. Among them, the electron gun controller 202 controls the electron gun 101, and thereby controls an acceleration voltage of the electron beam EB, a beam emission condition thereof, and the like.

Meanwhile, the electro-optical system controller 203 controls amounts of electric currents to be supplied to the electromagnetic lenses 102, 105, 108, 111, 114, 116, and 121 as well as other parameters and thereby adjusts magnifying power, a focal position, and the like of the electro-optical system formed from these electromagnetic lenses. The blanking controller 206 controls an application voltage to a blanking electrode 127. Thus, the blanking controller 206 deflects the electron beam EB having been generated before starting the exposure onto the shield plate 115 and thereby prevents the electron beam EB from being delivered onto the silicon substrate 11 prior to the exposure.

The substrate deflection controller 207 controls an application voltage to the fifth electrostatic deflector 119 and an amount of electric current to be supplied to the electrostatic deflector 120, thereby deflecting the electron beam EB toward a predetermined position on the silicon substrate 11.

The wafer stage controller 208 moves the silicon substrate 11 in the horizontal direction by adjusting a drive amount of a drive unit 125, thereby delivering the electron beam EB to a desired position on the silicon substrate 11. The controllers 201 to 208 are operated on the basis of exposure data which prescribes exposure conditions for each exposure shot supplied from an integrated control system 34. The exposure data are created by the integrated control system 34 formed from a workstation, for example.

Figure 5A:
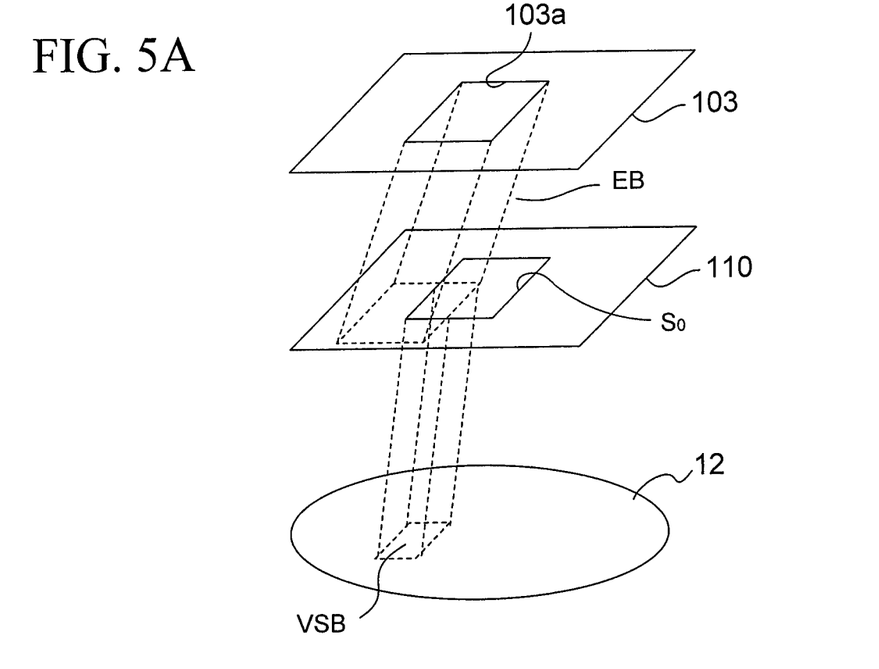
FIGS. 5A and 5B are views showing operational modes of the electron beam exposure apparatus of FIG. 4.

The above-described electron beam exposure apparatus 30 can perform exposure in accordance with a variable shaped beam (VSB) method and a character projection (CP) method. FIG. 5A is a view explaining the variable shaped beam method and FIG. 5B is a view explaining the character projection method.

As shown in FIG. 5A, in the variable shaped beam (VSB) method, part of the electron beam EB having passed through the rectangular aperture 103a of the beam shaping mask 103 is cut out by using a rectangular opening pattern $S_0$ provided in the exposure mask 110. Then, the rectangular electron beam EB having passed through the rectangular opening pattern $S_0$ is delivered onto the silicon substrate 11.

The above-described VSB method can produce electron beam shots in various rectangular shapes by adjusting the degree of overlap between the rectangular opening pattern $S_o$ and the electron beam having passed through the rectangular aperture 103a. Moreover, unlike in the point beam, an electric current density of the electron beam does not vary with a change in size of the electron beam shot. Accordingly, exposure time does not change even in the case of performing the exposure in a large area in a lump. As a consequence, the exposure in the large area in a lump makes it possible to achieve a drawing speed which is several tens to several hundreds times faster than the point beam method.

Figure 5B:
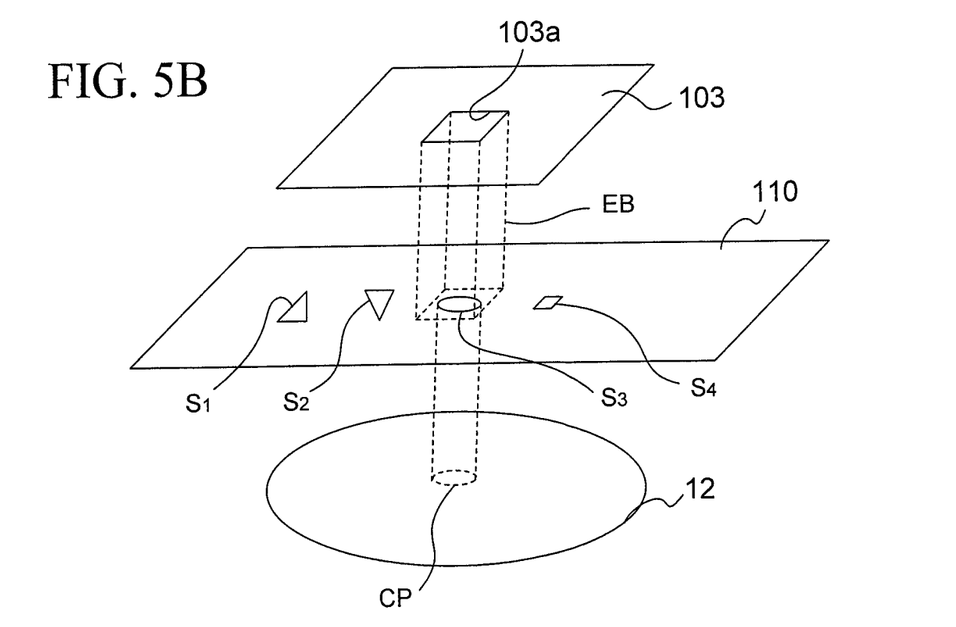

On the other hand, as shown in FIG. 5B, in the case of the CP method, the electron beam EB having passed through the rectangular aperture 103a of the beam shaping mask 103 is caused to further pass through any one of opening patterns $S_1$ to $S_4$ provided in the exposure mask 110. Thus, an electron beam shot is delivered in the same cross-sectional shape as the opening pattern which the electron beam has passed through.

In the CP method, an edge of the delivered electron beam EB is cut out by using the opening pattern $S_i$ of the exposure mask 110. Accordingly, any blurs of the electron beam EB generated by the electro-optical system located above the exposure mask 110 are not propagated. For this reason, the CP method can obtain sharper edges of the electron beam EB and higher resolution than the VSB method. In addition, the CP method can draw a complicated shape other than a rectangle in a single exposure operation. Accordingly, by preparing appropriate opening patterns, the CP method can also draw a pattern including a curved portion by performing a smaller number of times of exposure operations than those required in the case of using only the VSB method.

Here, the rectangular opening pattern $S_0$ shown in FIG. 5A and the opening patterns $S_1$ to $S_4$ shown in FIG. 5B may be formed on the same exposure mask 110.

In this embodiment, the exposure of patterns is performed by using only the CP method out of the above-described exposure methods.

Figure 6A:
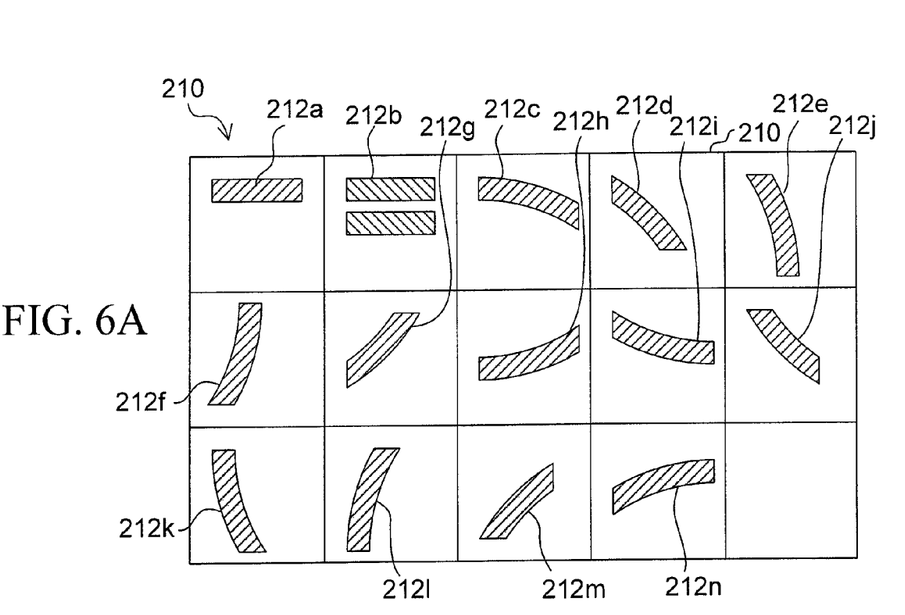
FIGS. 6A and 6B are views showing a pattern formation method for an optical resonator according to the first embodiment.
Figure 6B:
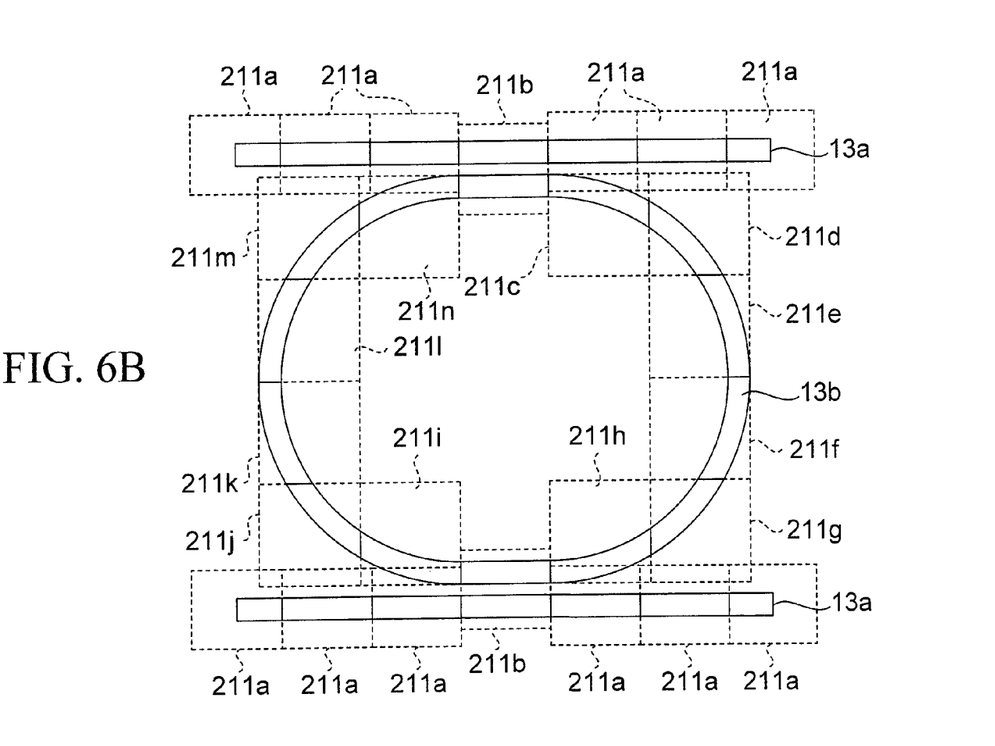

FIG. 6A shows an exposure mask used in exposure for a race-track optical resonator according to the first embodiment and FIG. 6B is a view showing an exposure method for the race-track optical resonator using the exposure mask of FIG. 6A.

As shown in FIG. 6B, in this embodiment, optical waveguides constituting the race-track optical resonator are divided into a plurality of small regions 211a to 211n.

Here, the gap portions between the linear waveguide patterns 13a and the annular waveguide pattern 13b constituting the race-track optical resonator are each defined as a portion including parallel linear lines, and each portion including the parallel linear lines is defined as a single small area 211b.

Meanwhile, each linear waveguide pattern 13a is divided into a plurality of small regions 211a whereas the annular pattern 13b is divided into small regions 211c to 211n.

Moreover, as shown in FIG. 6A, opening patterns 212a to 212n corresponding to the respective divided regions of the waveguide patterns are formed on an exposure mask 210.

Hence, the waveguide patterns 13a, 13b are drawn by performing the exposure of the divided regions in accordance with the CP method using the exposure mask 210.

Next, a method of processing joining portions of divided patterns will be described.

Figure 7A:
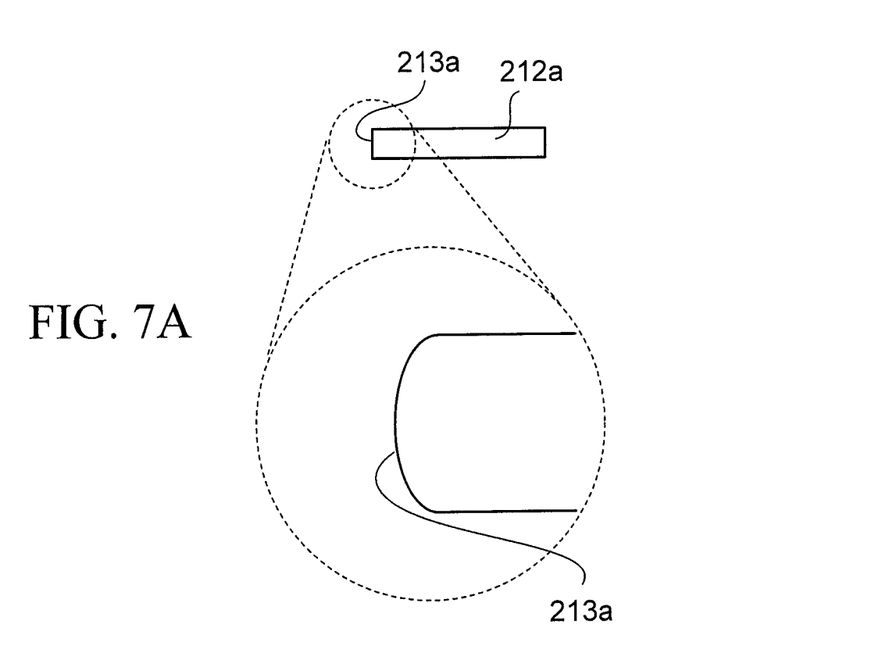
FIGS. 7A to 7C are views showing a method of processing joining portions of exposure patterns in an electron beam exposure method of the first embodiment.
Figure 7B:
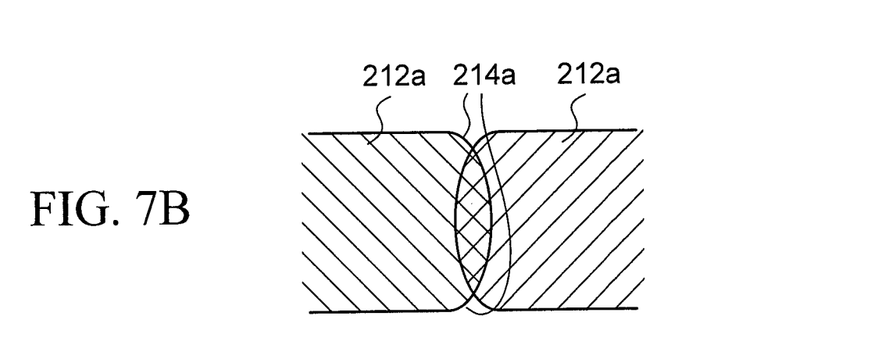
Figure 7C:
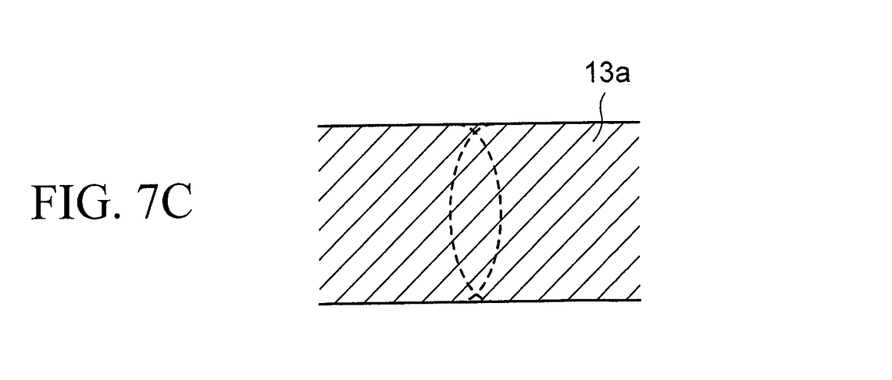

FIG. 7A is an enlarged view of an end portion of the opening pattern, FIG. 7B is a view showing an exposure method for joining portions of the waveguide patterns, and FIG. 7C is a view showing the joining portions of the waveguide patterns according to the method shown in FIG. 7B.

As shown in a partially enlarged view of FIG. 7A, an end portion of the opening pattern 212a of this embodiment includes a joining portion 213a, which is not simply formed from a right-angle edge only, but is instead formed from a slightly curved edge.

In this embodiment, the exposure is performed by locating exposure positions of two adjacent opening patterns 212a in such a way that the joining portions 213a thereof partially overlap each other as shown in FIG. 7B. In FIG. 7B, wedge-shaped recesses 214a are formed at a joint of the patterns. However, the recesses 214a are compensated by the thickening of pattern widths by exposing the overlapping joining portions 213a twice.

As a result, the waveguide pattern 13a without any recesses at the joint can be manufactured as shown in FIG. 7C.

According to the pattern exposure method for a race-track optical resonator of this embodiment, the electron beam exposure is performed in accordance with the CP method after dividing the waveguide patterns into the predetermined number of regions. Thus, the race-track optical resonator 10 can be formed by performing a small number of times of the exposure operations while reducing the roughness of the pattern edges. As a consequence, it is possible to significantly reduce the time required for the exposure as compared to the case of using the point beam method.

In addition, each gap portion 211b which is to determine the characteristic of the optical resonator 10 is formed by one exposure operation using a gap opening pattern 212b (FIG. 6A) configured by two parallel openings with a gap therebetween. Thus, it is possible to form the gap portion with extremely high accuracy while avoiding effects of drift of the electron beam and a variation in the electric current value.

Second Embodiment

Figure 8A:
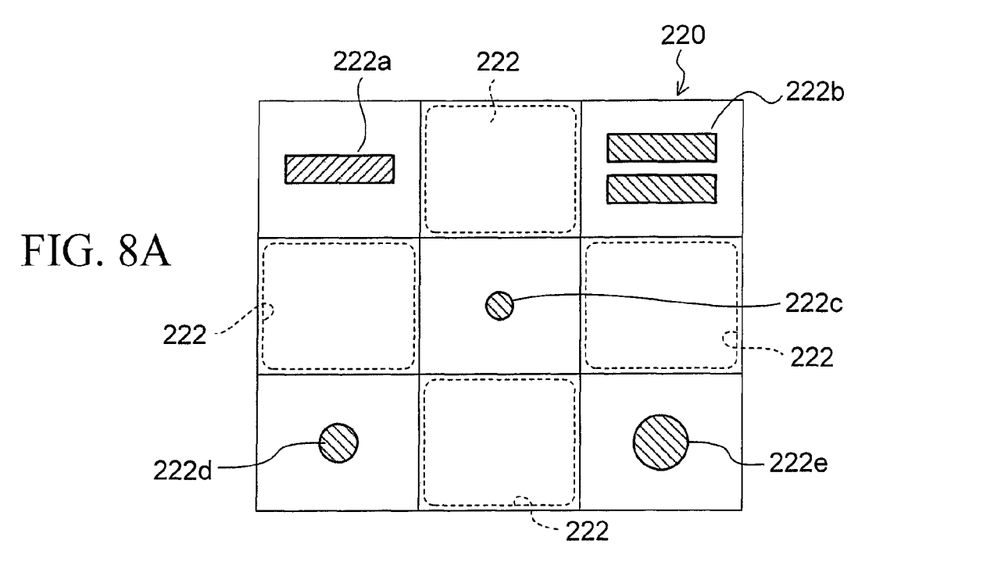
FIGS. 8A and 8B are views showing a pattern formation method for an optical resonator according to a second embodiment.
Figure 8B:
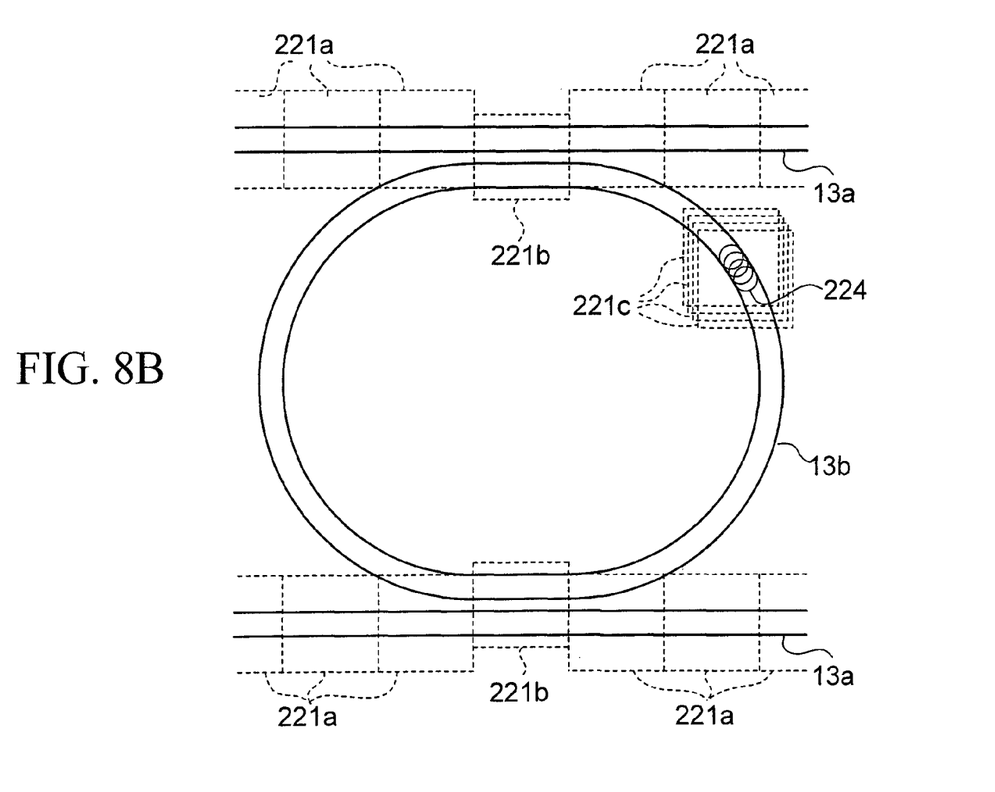

FIGS. 8A and 8B are views showing an electron beam exposure method according to a second embodiment.

As shown in FIG. 8A, circular opening patterns 222c, 222d, and 222e are formed in an exposure mask 220 of this embodiment as well as a linear opening pattern 222a and a gap opening pattern 222b. In addition, guard regions 222 with no opening patterns are provided in predetermined ranges above and below as well as on the right and left of each of the circular opening patterns 222c, 222d, and 222e. Illustration of some of the guard regions corresponding to the opening patterns 222d, 222e is omitted in FIG. 8A.

As noted above, the exposure mask 220 is also provided with a linear opening pattern 222a for forming a linear waveguide pattern, and a gap opening pattern 222b for forming a gap portion. As shown, the gap opening pattern 222b is configured by two parallel openings between which a predetermined gap is formed.

As shown in FIG. 8B, the linear waveguide patterns 13a and the gap portions between the waveguide patterns 13a and the waveguide pattern 13b are drawn by the exposure in accordance with the CP method using the opening patterns 222a, 222b in this embodiment as well.

On the other hand, a curved portion of the annular waveguide pattern 13b is drawn by the exposure while shifting and overlapping electron beam shots 224 shaped with the opening pattern 222c. Each circular electron beam shot 224 has a diameter which is substantially equal to the line width of the waveguide pattern 13b.

In this case, the exposure using the circular electron beam shots 224 overlaps the exposure through the opening pattern 222 at joints between the curved portions and the gap portions of the waveguide pattern 13b, whereby the line width is more likely to be thickened at the joints.

To avoid such thickening, joining portions of the curved portions and the gap portions of the waveguide pattern 13b are subjected to the exposure in accordance with the following method in this embodiment.

Figure 9A:
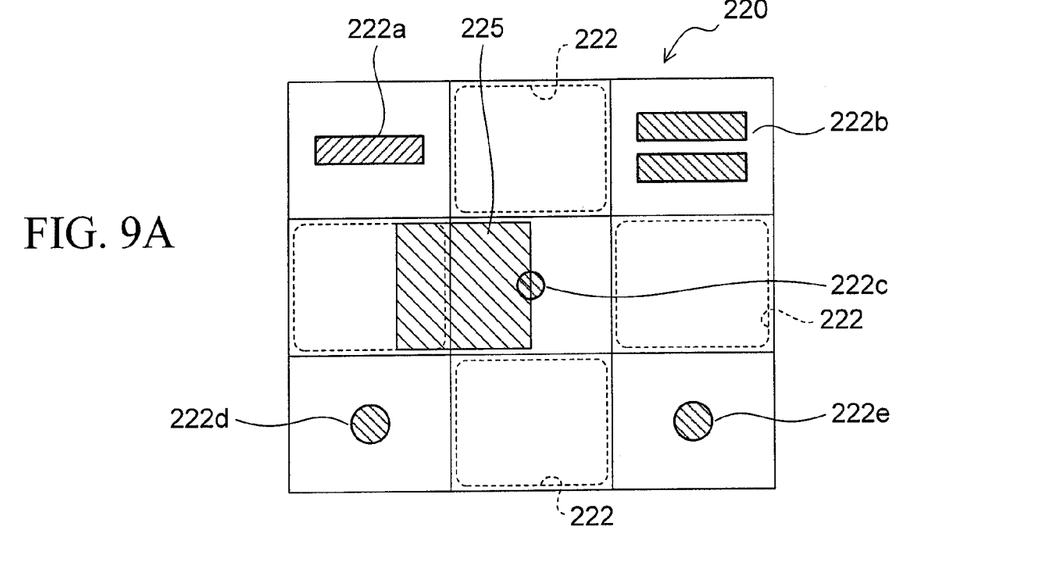
FIGS. 9A and 9B are views showing a method of processing a joining portion of a curved pattern and a linear pattern in an electron beam exposure method of FIGS. 8A and 8B.
Figure 9B:
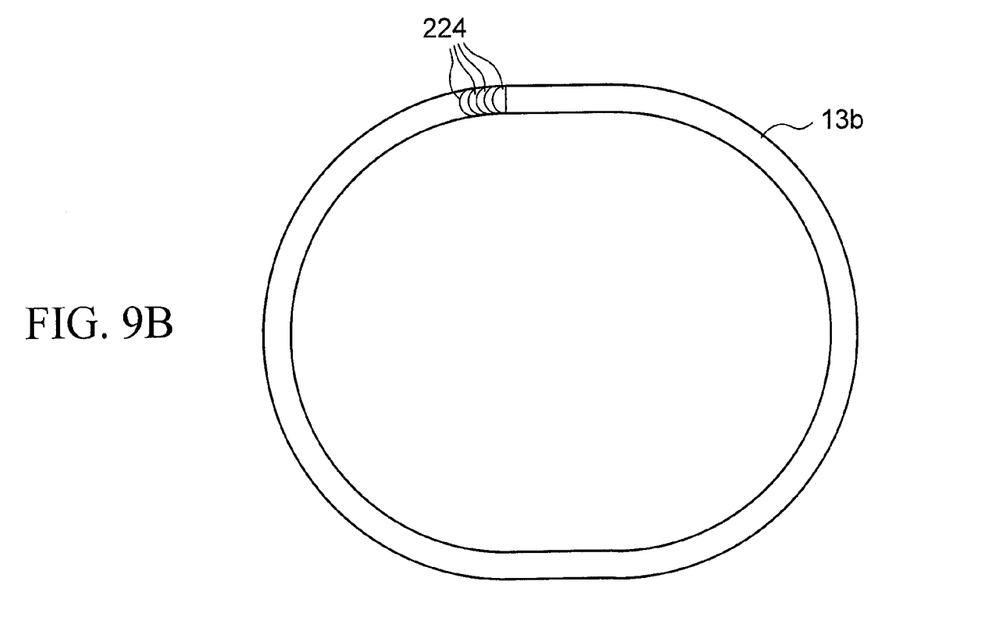

FIGS. 9A and 9B are views showing a method of processing a joint between a curved portion and a gap portion in the electron beam exposure method of this embodiment.

In this embodiment, as shown in FIG. 9B, the exposure is performed in such a way that the circular electron beam shot does not extend off from a terminal edge portion of the curved portion of the waveguide pattern 13b. This makes it possible to avoid the overlap of the exposure between the gap portion and the curved portion and to avoid thickening of the line width at the joint of the gap portion and the curved portion.

As shown in FIG. 9A, the above-described prevention of the circular electron beam shot from extending off is achieved by adjusting an overlap between the opening pattern 222c of the exposure mask 220 and a rectangular beam shot 225 shaped by the rectangular aperture 103a of the beam shaping mask 103. Specifically, when the position of irradiation with the circular electron beam shot 224 comes close to a boundary between the curved portion and the gap portion, the position of irradiation with the rectangular electron beam shot 225 is shifted. Hence, the position of irradiation is adjusted in such a way that only part of the rectangular beam shot 225 overlaps the opening pattern 222c. Thus, the circular electron beam shot 224 can be prevented from extending off into the gap portion side.

In this case, the guard regions 222 without any formed patterns are provided above and below as well as on the right and left of the opening pattern 222c of the exposure mask 220. For this reason, when the position of irradiation of the rectangular electron beam shot 225 is shifted for processing the joint of the curved portion, the electron beam can be prevented from passing through any opening patterns other than the opening pattern 222c.

As described above, in this embodiment, the curved waveguide pattern is formed by joining the electron beam shots having the circular cross section. This makes it possible to form waveguide patterns having various curvatures.

In addition, it is possible to reduce the number of times of exposure operations as compared to the point beam method. Thus, the time required for drawing the waveguide patterns is shortened.

Third Embodiment

Figure 10A:
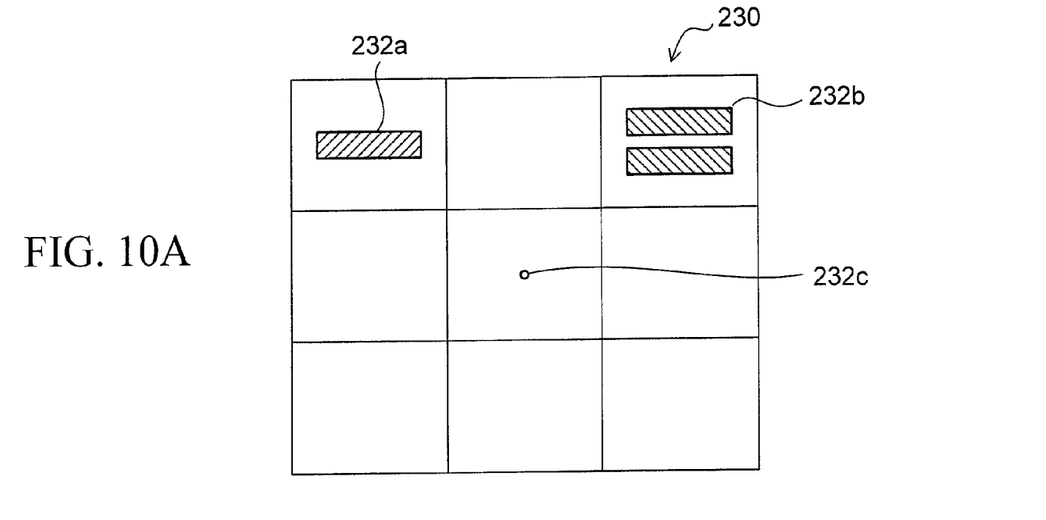
FIGS. 10A and 10B are views showing a pattern formation method for an optical resonator according to a third embodiment.
Figure 10B:
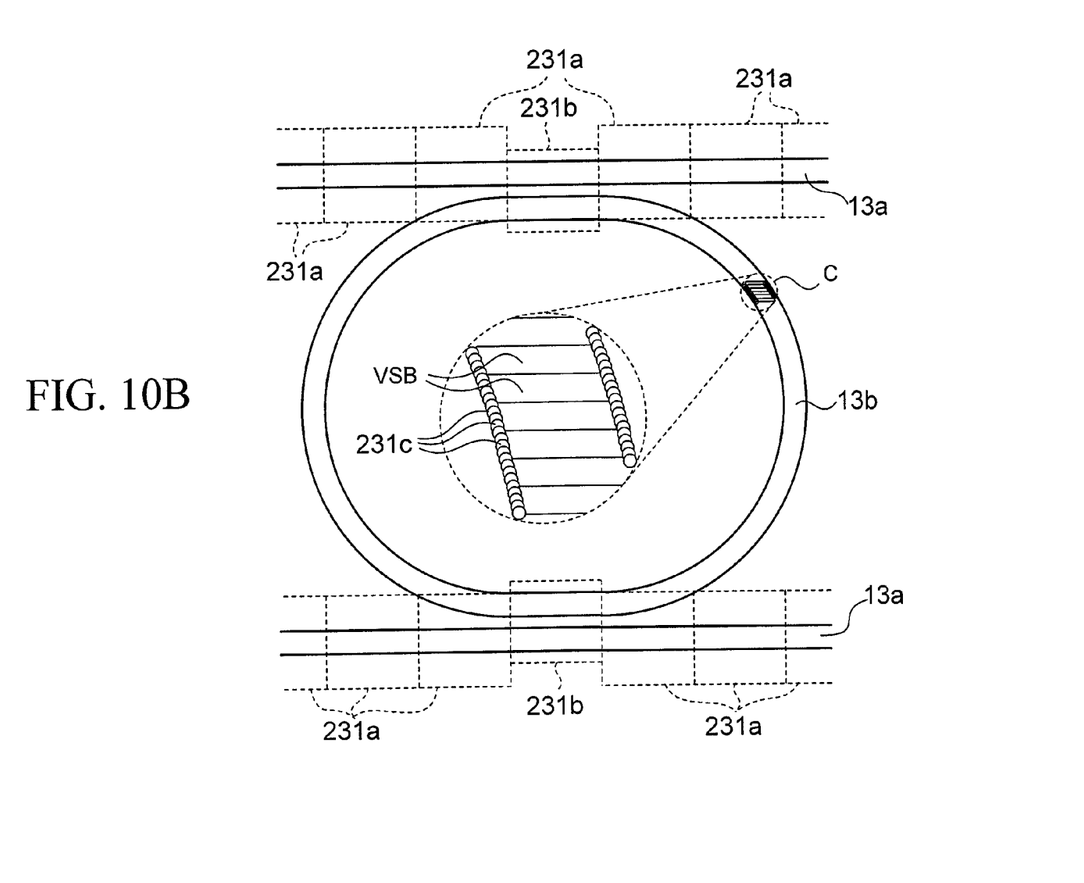

FIGS. 10A and 10B are views showing an electron beam exposure method according to a third embodiment.

As shown in FIG. 10A, an exposure mask 230 of this embodiment is provided with a linear opening pattern 232a for forming the linear waveguide pattern 13a, a gap opening pattern 232b for forming the gap portion, and a circular opening pattern 232c. Note that, although not shown, the exposure mask 230 of this embodiment is further provided with a rectangular opening pattern such as an opening $S_o$ shown in FIG. 5A so as to perform electron beam exposure including a variable shaped beam (VSB) method.

A diameter of the circular opening pattern 232c is formed smaller in size than line widths of the waveguide patterns 13a, 13b.

As shown in FIG. 10b, the linear waveguide patterns 13a and the gap portions between the waveguide patterns 13a and the waveguide pattern 13b are subjected to exposure in accordance with the CP method, as in the case of the method shown in FIG. 6.

As shown in a partially enlarged view in FIG. 10B, regarding the curved portion of the waveguide pattern 13b, a portion near each edge where reduction in roughness is required is subjected to the exposure by using circular electron beam shots 231c.

Meanwhile, as shown in FIG. 10B, an internal part of the curved portion which requires relatively low accuracy is subjected to exposure in accordance with the VSB method described above with reference to FIG. 5A. Since the exposure in the VSB method is used as well, it is possible to draw the pattern by performing a small number of times of exposure operations as compared to the case of using only the point beam.

Here, a pitch of the circular electron beam shots 231c is determined by the following method in compliance with the diameter of the electron beam shots and the required roughness.

FIGS. 11A to 11D are views showing a relationship between the pitch of the circular electron beam shot 231c and the size of the edge roughness.

Figure 11A:
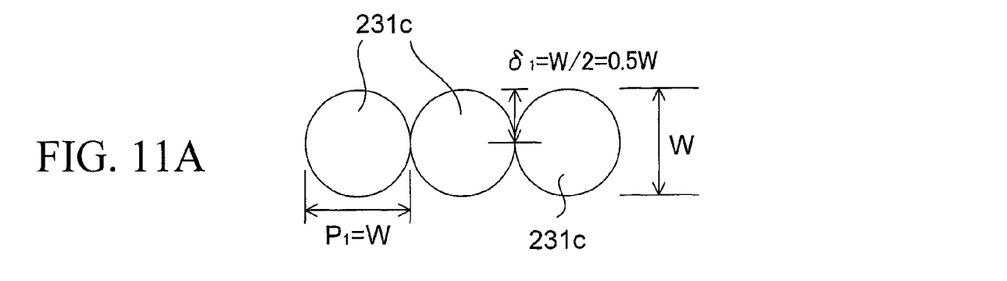
FIGS. 11A to 11D are views showing a relationship between overlaps of circular shots and edge roughness.

FIG. 11A shows a case where a pitch $P_1$ of the circular electron beam shots 231c is set equal to a diameter W of each circular electron beam shot 231c. In this case, roughness $\delta_1$ which is half as large as the diameter W of the electron beam shot occurs as shown in FIG. 11A.

Figure 11B:
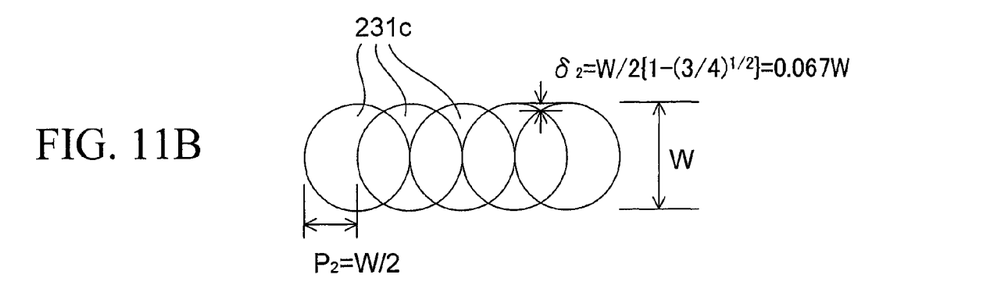

FIG. 11B shows a case where a pitch $P_2$ of the electron beam shots 231c is set half as large as the diameter W of the circular electron beam shot 231c. In this case, roughness $\delta_2$ which is about 0.067 times as large as the diameter W of the electron beam shot occurs as shown in FIG. 11B.

For example, when the diameter W of the electron beam shot 231c is set to 60 nm and the pitch of the electron beam shots 231c is set half as large as the diameter W, the roughness occurring in this case is estimated to be about 4.02 nm. This value has been confirmed to coincide with an experiment result obtained by the inventors of this application.

Figure 11C:
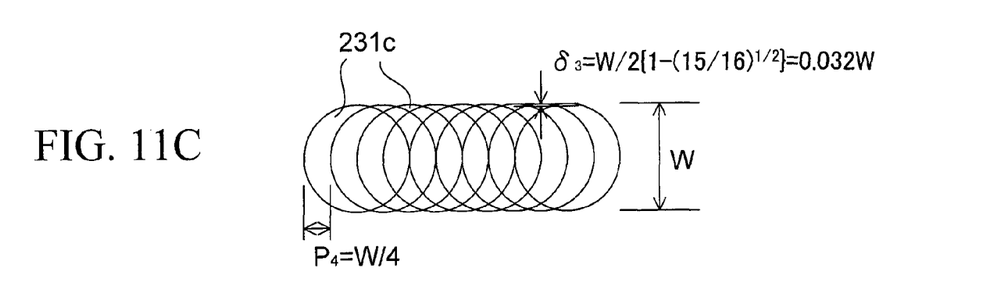

FIG. 11C shows a case where a pitch $P_3$ of the electron beam shots 231c is set a quarter as large as the diameter W of the circular electron beam shot 231c. Roughness $\delta_3$ which is about 0.032 times as large as the diameter W of the electron beam shot occurs in this case.

Figure 11D:
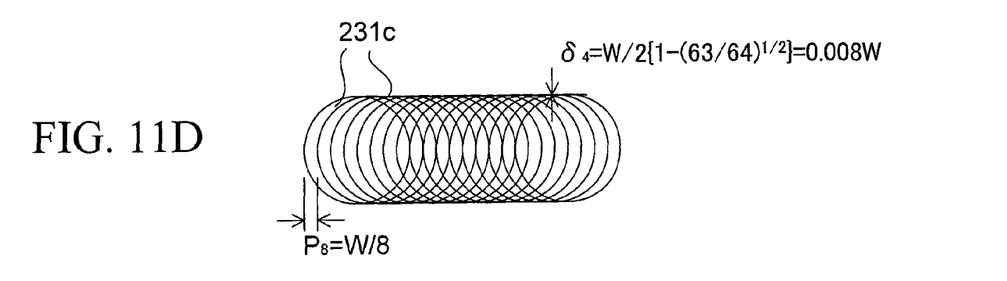

Furthermore, FIG. 11D shows a case where a pitch $P_4$ of the electron beam shots 231c is set one-eighth as large as the diameter W of the circular electron beam shot 231c. Roughness $\delta_4$ which is about 0.008 times as large as the diameter W of the electron beam shot occurs in this case.

As described above, the roughness occurring at the edge portions becomes less as the pitch of the circular electron beam shots 231c is set smaller.

To reduce the number of times of the exposure operations, it is desirable to set the pitch of the circular electron beam shots 231c as large as possible insofar as the tolerable edge roughness can be achieved.

When the electron beam 231c shots having the diameter of 60 nm are used, for example, the roughness can be reduced to about 4 nm by setting the pitch to 30 nm (½W). Thus, it is possible to obtain a sufficient outcome as the waveguide pattern.

In this embodiment, the pitch of the circular electron beam shots 231c at a peripheral edge on an inner peripheral side of the curved portion of the waveguide pattern 13b in FIG. 10B is set equal to the pitch of the circular electron beam shots 231c at a peripheral edge on an outer peripheral side thereof. Thus, it is possible to prevent a problem of a difference in size of roughness between the inner peripheral side and the outer peripheral side of the waveguide pattern 13b.

In this embodiment, it is possible to draw curved patterns in various sizes without being limited by the diameter of the circular electron beam shot 231c. In addition, it is possible to draw a large-area pattern by a small number of times of the exposure operations by using the exposure in the VSB method as appropriate, and thereby to manufacture the optical element promptly.

What is claimed is:

1. An electron beam exposure method comprising the steps of:
    preparing an exposure mask including a linear opening pattern, a gap opening pattern configured by two parallel openings with a gap therebetween, and a circular opening pattern having a diameter equal to a width of the linear opening pattern;
    drawing a linear portion of a drawing object pattern by repeating exposure with an electron beam passing through the linear opening pattern;
    drawing a curved portion of the drawing object pattern by repeating exposure with an electron beam passing through the circular opening pattern while shifting and overlapping exposure positions of the electron beam; and
    drawing a gap portion of the drawing object pattern by one exposure operation with an electron beam passing through the gap opening pattern,
    wherein in drawing a junction between the curved portion and the linear portion of the drawing object pattern, the curved portion is drawn in such a manner that a position of a rectangular electron beam to be delivered to the circular opening pattern is adjusted depending on the exposure positions to prevent the electron beam from entering the liner portion from the curved portion.

2. The electron beam exposure method according to claim 1, wherein
    each end portion serving as a joint in the linear opening pattern is provided with a joining portion tapered in a width of the opening pattern, and
    in the step of drawing a linear portion of the drawing object pattern, the exposure is performed in such a way that portions drawn through every adjacent joining portions overlap each other.

3. The electron beam exposure method according to claim 1, wherein the step of drawing a curved portion of the drawing object pattern includes the steps of:
    preparing a beam shaping mask for shaping the electron beam to a desired shape before the electron beam reaching the exposure mask; and
    adjusting an overlap between the circular opening pattern on the exposure mask and a rectangular beam shot of the electron beam shaped by the beam shaping mask, thereby drawing the curved portion only by a part of the rectangular beam shot overlaps the circular opening pattern.

4. The electron beam exposure method according to claim 3, wherein the exposure mask further includes guard regions that surround the circular opening pattern.

* * * * *